United States Patent
Cheng et al.

(10) Patent No.: US 11,696,518 B2
(45) Date of Patent: Jul. 4, 2023

(54) HYBRID NON-VOLATILE MEMORY CELL

(71) Applicant: INTERNATIONAL BUSINESS MACHINES CORPORATION, Armonk, NY (US)

(72) Inventors: Kangguo Cheng, Schenectady, NY (US); Carl Radens, LaGrangeville, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 16/949,909

(22) Filed: Nov. 20, 2020

(65) Prior Publication Data

US 2022/0165944 A1    May 26, 2022

(51) Int. Cl.
| | |
|---|---|
| *H10N 70/20* | (2023.01) |
| *G11C 13/00* | (2006.01) |
| *H10B 63/00* | (2023.01) |
| *H10N 70/00* | (2023.01) |

(52) U.S. Cl.
CPC ....... *H10N 70/231* (2023.02); *G11C 13/0007* (2013.01); *H10B 63/20* (2023.02); *H10N 70/063* (2023.02); *H10N 70/068* (2023.02); *H10N 70/841* (2023.02); *H10N 70/8833* (2023.02)

(58) Field of Classification Search
CPC .................................................. H01L 45/1266
See application file for complete search history.

(56) References Cited

U.S. PATENT DOCUMENTS

| | | |
|---|---|---|
| 7,656,696 B2 | 2/2010 | Joo |
| 7,939,366 B2 | 5/2011 | Song |
| 8,026,502 B2 | 9/2011 | Kakegawa |
| 9,082,964 B2 | 7/2015 | Hong |
| 9,444,046 B2 | 9/2016 | Pio |
| 9,680,092 B2 | 6/2017 | Nardi |

(Continued)

FOREIGN PATENT DOCUMENTS

| | | |
|---|---|---|
| GB | 2552014 A | 1/2018 |
| JP | 5503416 B2 | 12/2011 |

(Continued)

OTHER PUBLICATIONS

Notification of Transmittal of the International Search Report and the Written Opinion of the International Searching Authority, or the Declaration, dated Feb. 28, 2022, Applicant's or agent's file, International application No. PCT/EP2021/081868, 11 pages.
IBM: List of IBM Patents or Patent Applications Treated as Related (Appendix P), Sep. 13, 2021, 2 pages.
Pending U.S. Appl. No. 17/472,145, filed Sep. 10, 2021, entitled: "Hybrid Memory for Neuromorphic Applications", 48 pages.

(Continued)

*Primary Examiner* — Mounir S Amer
(74) *Attorney, Agent, or Firm* — L. Jeffrey Kelly

(57) ABSTRACT

A non-volatile memory structure, and methods of manufacture, which may include a first memory element and a second memory element between a first terminal and a second terminal. The first memory element and the second memory element may be in parallel with each other between the first and second terminal. This may enable the hybrid non-volatile memory structure to store values as a combination of the conductance for each memory element, thereby enabling better tuning of set and reset conductance parameters.

22 Claims, 4 Drawing Sheets

(56) References Cited

U.S. PATENT DOCUMENTS

| | | |
|---|---|---|
| 9,837,472 B2 | 12/2017 | Shepard |
| 9,865,322 B2 | 1/2018 | Dray |
| 9,917,104 B1 | 3/2018 | Roizin |
| 9,946,969 B2 | 4/2018 | Friedman |
| 10,048,962 B2 | 8/2018 | Amidi |
| 10,056,545 B2 | 8/2018 | Sato |
| 10,109,675 B2 | 10/2018 | Annunziata |
| 10,454,025 B1 | 10/2019 | Cheng |
| 2010/0054029 A1 | 3/2010 | Happ |
| 2012/0084240 A1 | 4/2012 | Esser |
| 2012/0084241 A1 | 4/2012 | Friedman |
| 2017/0109628 A1 | 4/2017 | Gokmen |
| 2018/0095930 A1 | 4/2018 | Lu |
| 2018/0330236 A1 | 11/2018 | Hou |
| 2019/0296081 A1* | 9/2019 | Sharma ................. H01L 45/147 |
| 2020/0219933 A1 | 7/2020 | Cheng |
| 2022/0093860 A1* | 3/2022 | Loy ...................... H01L 45/145 |

FOREIGN PATENT DOCUMENTS

| | | |
|---|---|---|
| JP | 55034162 A | 12/2011 |
| WO | 2022106422 A1 | 5/2022 |

OTHER PUBLICATIONS

Eryilmaz et al., "Brain-like associative learning using a nanoscale non-volatile phase change synaptic device array", frontiers in Neuroscience, Jul. 2014 | vol. 8 | Article 205, 11 pages.

Mostafa et al., "Implementation of a spike-based perceptron learning rule using TiO2-x memristors", Frontiers in Neurosciences vol. 9 No. 357, Oct. 2015, 12 pages.

Woo et al., "Optimized Programming Scheme Enabling Linear Potentiation in Filamentary HfO2 RRAM Synapse for Neuromorphic Systems", Published in: IEEE Transactions on Electron Devices, vol. 63, Issue 12, Dec. 2016, 3 pages.

* cited by examiner

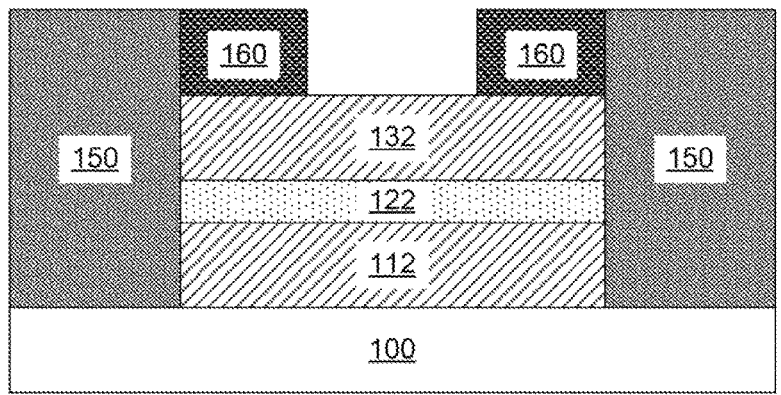 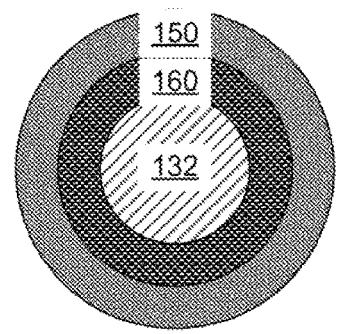
FIG. 7A  FIG. 7B
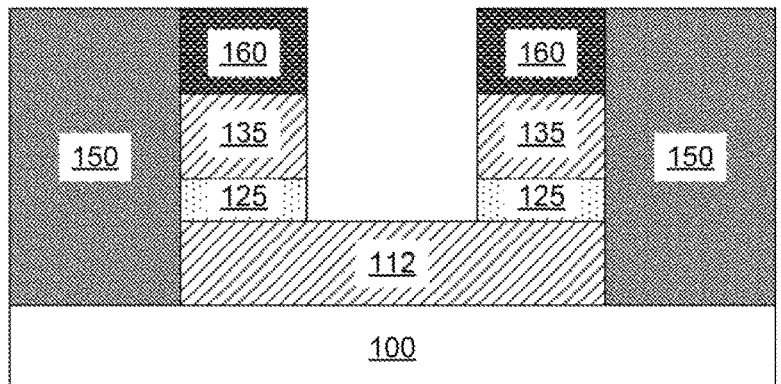 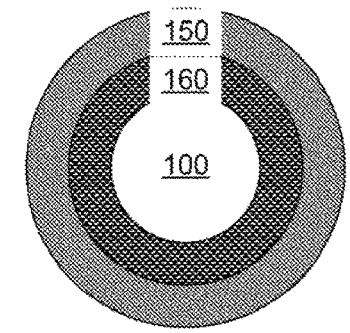
FIG. 8A  FIG. 8B
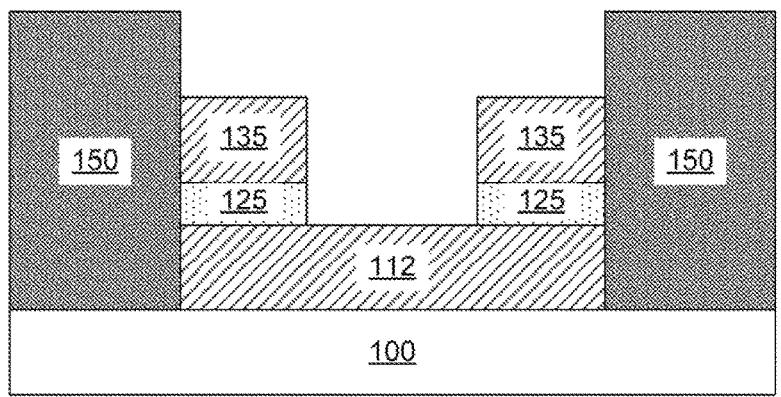 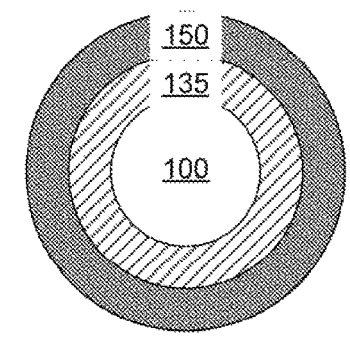
FIG. 9A  FIG. 9B

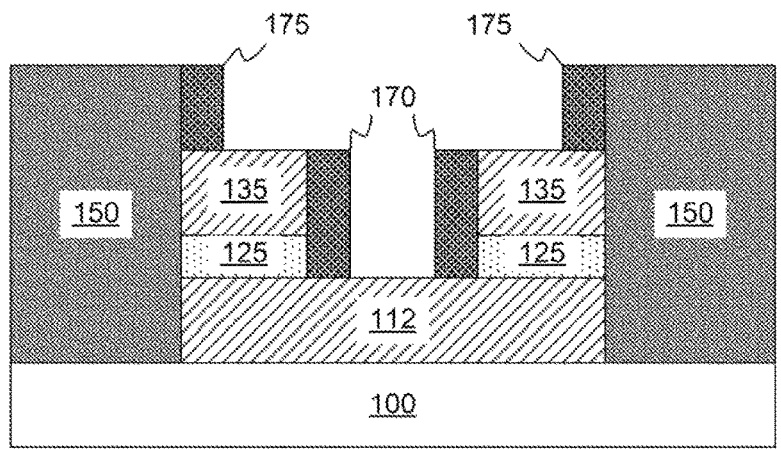 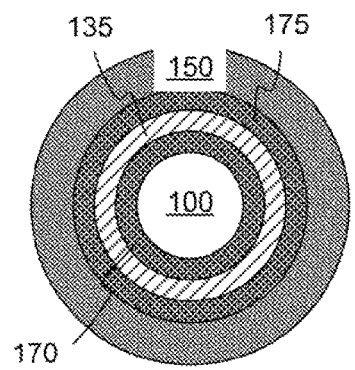
FIG. 10A　　　　FIG. 10B
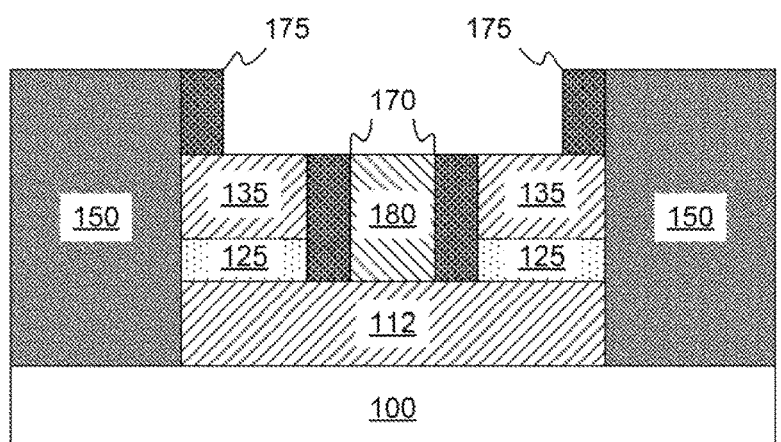 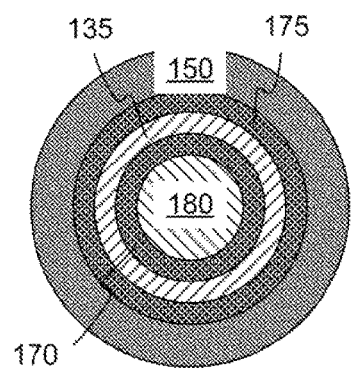
FIG. 11A　　　　FIG. 11B
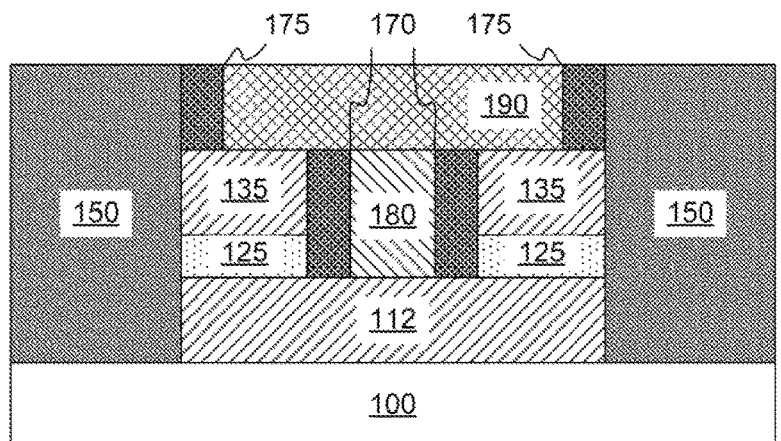 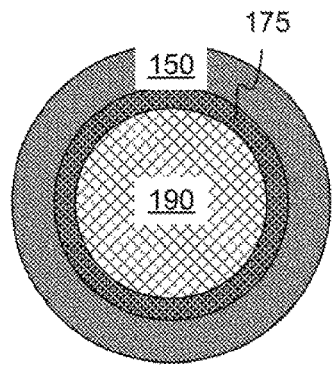
FIG. 12A　　　　FIG. 12B

HYBRID NON-VOLATILE MEMORY CELL

BACKGROUND

The present invention relates to non-volatile memory, and more specifically, to a memristive device for neuromorphic computing.

"Machine learning" is used to broadly describe a primary function of electronic systems that learn from data. In accelerated machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANN architectures, neuromorphic microchips and ultra-high density non-volatile memory can be formed from high density, low cost circuit architectures known as cross-bar arrays. A basic crossbar array configuration includes a set of conductive row wires and a set of conductive column wires formed to intersect the set of conductive row wires. The intersections between the two sets of wires are separated by so-called crosspoint devices, which can be formed from thin film material. Cross-point devices can be implemented as so-called memristive devices. Characteristics of a memristive device include non-volatility, the ability to store a variable resistance value, and the ability to tune up or tune down a resistance using current or voltage pulses.

BRIEF SUMMARY

A non-volatile memory structure may include a first memory element, a second memory element, a top contact, and a bottom contact. The top contact and the bottom contact may be in contact with a portion of each memory element. This may enable the hybrid non-volatile memory structure to store values as a combination of the conductance for each memory element, thereby enabling better tuning of set and reset conductance parameters.

The non-volatile memory structure of the embodiment of paragraph [0003] may include the first memory element and the second memory element having different conductance changes for set and reset operations. This may enable the hybrid non-volatile memory structure to store values as a combination of the conductance for each memory element, thereby enabling better tuning of set and reset conductance parameters.

The non-volatile memory structure of the embodiment of paragraph [0003] may include the first memory element and the second memory element being different types of memristive memory. This may enable the hybrid non-volatile memory structure to store values as a combination of the conductance for each memory element, thereby enabling better tuning of set and reset conductance parameters.

The non-volatile memory structure of the embodiment of paragraph [0003] may include the first memory element being a phase change memory and the second memory element being a resistive random-access memory. This may enable the hybrid non-volatile memory structure to store values as a combination of the conductance for each memory element, thereby enabling better tuning of set and reset conductance parameters.

The non-volatile memory structure of the embodiment of paragraph [0003] may be a combination of the state of the first memory element and the second memory element. This may enable the hybrid non-volatile memory structure to store values as a combination of the conductance for each memory element, thereby enabling better tuning of set and reset conductance parameters.

A non-volatile memory structure may include a first memory element, a second memory element between a first terminal and a second terminal. The first memory element and the second memory element may be in parallel with each other between the first and second terminal. This may enable the hybrid non-volatile memory structure to store values as a combination of the conductance for each memory element, thereby enabling better tuning of set and reset conductance parameters.

The non-volatile memory structure of the embodiment of paragraph [0008] may include the first memory element and the second memory element having different conductance changes for set and reset operations. This may enable the hybrid non-volatile memory structure to store values as a combination of the conductance for each memory element, thereby enabling better tuning of set and reset conductance parameters.

The non-volatile memory structure of the embodiment of paragraph [0008] may include the first memory element and the second memory element being different types of memristive memory. This may enable the hybrid non-volatile memory structure to store values as a combination of the conductance for each memory element, thereby enabling better tuning of set and reset conductance parameters.

The non-volatile memory structure of the embodiment of paragraph [0008] may include the first memory element being a phase change memory and the second memory element being a resistive random-access memory. This may enable the hybrid non-volatile memory structure to store values as a combination of the conductance for each memory element, thereby enabling better tuning of set and reset conductance parameters.

The non-volatile memory structure of the embodiment of paragraph [0008] may be a combination of the state of the first memory element and the second memory element. This may enable the hybrid non-volatile memory structure to store values as a combination of the conductance for each memory element, thereby enabling better tuning of set and reset conductance parameters.

A non-volatile memory structure may include a first memory element, a second memory element be in parallel with each other. The first memory element may be a first type of memristor, and the second memory element may be a second type of memristor. The state of the non-volatile memory structure may be a combination of the state of the first memory element and the second memory element. This may enable the hybrid non-volatile memory structure to store values as a combination of the conductance for each memory element, thereby enabling better tuning of set and reset conductance parameters.

The non-volatile memory structure of the embodiment of paragraph [0013] may include the first memory element and the second memory element having different conductance changes for set and reset operations. This may enable the hybrid non-volatile memory structure to store values as a combination of the conductance for each memory element, thereby enabling better tuning of set and reset conductance parameters.

The non-volatile memory structure of the embodiment of paragraph [0013] may include the first memory element and the second memory element being different types of memristive memory. This may enable the hybrid non-volatile memory structure to store values as a combination of the conductance for each memory element, thereby enabling better tuning of set and reset conductance parameters.

The non-volatile memory structure of the embodiment of paragraph [0013] may include the first memory element being a phase change memory and the second memory element being a resistive random-access memory. This may enable the hybrid non-volatile memory structure to store values as a combination of the conductance for each memory element, thereby enabling better tuning of set and reset conductance parameters.

A non-volatile memory structure may include a first memory element, a second memory element, a top contact, and a bottom contact. The top contact and the bottom contact may be in contact with a portion of each memory element. The first memory element may encircle the second memory element. This may enable the hybrid non-volatile memory structure to store values as a combination of the conductance for each memory element, thereby enabling better tuning of set and reset conductance parameters.

The non-volatile memory structure of the embodiment of paragraph [0017] may include the first memory element and the second memory element having different conductance changes for set and reset operations. This may enable the hybrid non-volatile memory structure to store values as a combination of the conductance for each memory element, thereby enabling better tuning of set and reset conductance parameters.

The non-volatile memory structure of the embodiment of paragraph [0017] may include the first memory element and the second memory element being different types of memristive memory. This may enable the hybrid non-volatile memory structure to store values as a combination of the conductance for each memory element, thereby enabling better tuning of set and reset conductance parameters.

The non-volatile memory structure of the embodiment of paragraph [0017] may include the first memory element being a phase change memory and the second memory element being a resistive random-access memory. This may enable the hybrid non-volatile memory structure to store values as a combination of the conductance for each memory element, thereby enabling better tuning of set and reset conductance parameters.

The non-volatile memory structure of the embodiment of paragraph [0017] may be a combination of the state of the first memory element and the second memory element. This may enable the hybrid non-volatile memory structure to store values as a combination of the conductance for each memory element, thereby enabling better tuning of set and reset conductance parameters.

A method of forming the non-volatile memory structure may include patterning a hybrid cell from a first memory material stack. The method may include removing a portion of the first memory material stack in the hybrid cell. The method may include forming a second memory material stack in an area created by the removed portion of the first memory material stack. This may enable formation of the hybrid non-volatile memory structure to store values as a combination of the conductance for each memory element, thereby enabling better tuning of set and reset conductance parameters.

The method may further include the first memory element and the second memory element being different types of memristive memory. This may enable formation of the hybrid non-volatile memory structure to store values as a combination of the conductance for each memory element, thereby enabling better tuning of set and reset conductance parameters.

The method may further include the first memory element being a phase change memory, and the second memory element being a resistive random-access memory. This may enable formation of the hybrid non-volatile memory structure to store values as a combination of the conductance for each memory element, thereby enabling better tuning of set and reset conductance parameters.

The method may further include depositing a conformal layer over the hybrid cell and an ILD encircling the hybrid cell. The method may further include performing an anisotropic etch on the conformal layer forming spacers on a sidewall of the ILD encircling the hybrid cell and located above the hybrid cell. The method may further include removing the first memory material stack that is not located beneath the spacers. This may enable formation of the hybrid non-volatile memory structure to store values as a combination of the conductance for each memory element, thereby enabling better tuning of set and reset conductance parameters.

The method may further include depositing a conformal layer over the hybrid cell. The method may further include performing an anisotropic etch of the conformal layer to create a spacer along a vertical sidewall of the first memory material stack. The method may further include depositing a second memory material stack in a remaining area of the removed portion of the first memory material stack. This may enable formation of the hybrid non-volatile memory structure to store values as a combination of the conductance for each memory element, thereby enabling better tuning of set and reset conductance parameters.

BRIEF DESCRIPTION OF THE DRAWINGS

FIGS. 7A and 7B depict a cross-sectional view and top view, respectively, of depositing a pattern for a second memory element on the first material stack, according to an example embodiment.

FIGS. 8A and 8B depict a cross-sectional view and top view, respectively, of removing the first material stack from the area patterned for the second memory element on to form the first memory element, according to an example embodiment.

FIGS. 9A and 9B depict a cross-sectional view and top view, respectively, of removing a pattern for a second memory element on the first material stack, according to an example embodiment.

FIGS. 10A and 10B depict a cross-sectional view and top view, respectively, of depositing spacers to isolate a second memory element from the first memory element, according to an example embodiment.

FIGS. 11A and 11B depict a cross-sectional view and top view, respectively, of depositing a material for the second memory element, according to an example embodiment.

FIGS. 12A and 12B depict a cross-sectional view and top view, respectively, of depositing a material for the second memory element, according to an example embodiment.

Figure 1:
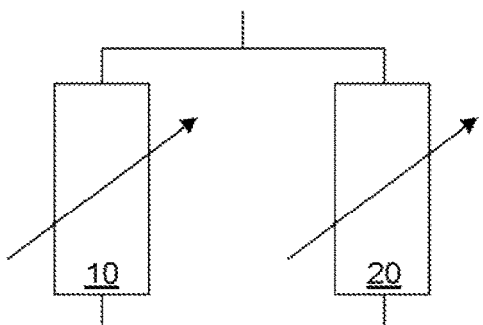
FIG. 1 depicts an electrical diagram for an arrangement of a hybrid memory structure, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Analog computing uses memory devices, such as memristors, that store information as a range of conductance of the memory device. In a preferred scenario, set and reset operations on the memory device would be gradual, and more preferably set and reset operations would be mirrored/reversible (e.g., 1 set pulse and 1 reset pulse would return to the same conductance value). Memory devices using phase change materials (PCM) may exhibit a gradual conductance change during set operations and have an abrupt change during reset operations. Conversely, memory devices using Resistive Random-Access Memory (ReRAM) may exhibit an abrupt change in conductance during set operations and a gradual change during reset operations.

FIG. 1 depicts an electrical diagram for an arrangement of a hybrid memory structure, according to an example embodiment. The hybrid memory structure includes first memory element 10 and a second memory element 20. In such a hybrid memory structure, the first memory element 10 may be a memristor having an abrupt conductance change (e.g., conductance sharply drops to near minimum conductance) during reset operations, such as a PCM device. In such a hybrid memory structure, the second memory element 20 may be a memristor having an abrupt conductance change during set operations, such as a ReRAM device. By connecting such devices in parallel, the combined operation of a hybrid cell will exhibit gradual conductance changes, as the summation of the conductance of the parallel elements of the circuit will be dominated by the element undergoing gradual change (as opposed to the abrupt change). In such a hybrid memory cell, the first memory element 10 and the second memory element 20 may share common read and ground electrodes or contacts (e.g., the same top contact and the same bottom contact), such that the first memory element 10 and the second memory element 20 act as a single memory cell and are electrically inseparable. Further, the hybrid memory cell may store the state of the memory cell (e.g., an analog value) as a combination of the states of the first memory element 10 and the second memory element 20.

Figure 2:
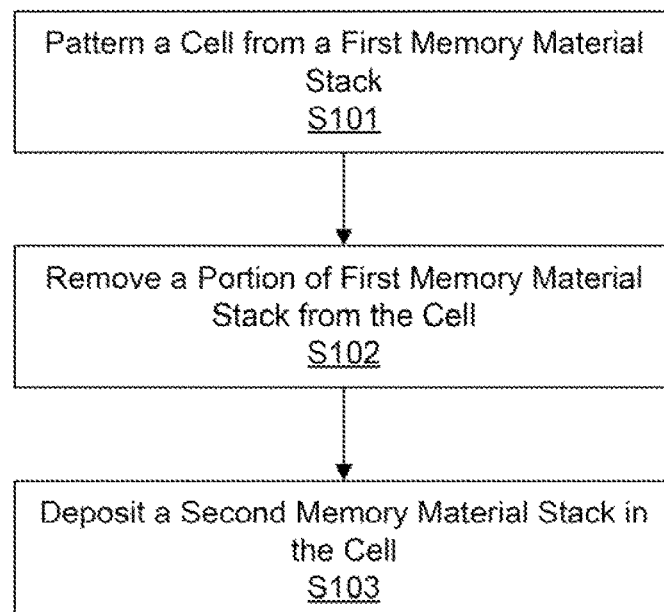
FIG. 2 depicts a method of forming an arrangement of an improved memory structure having a first memory element and a second memory element, according to an example embodiment.

FIG. 2 depicts a method of forming an arrangement of an improved memory structure having a first memory element and a second memory element, according to an example embodiment. Referring to step S101, the footprint of a hybrid cell may be patterned from a material stack for a first memory. An example embodiment of this step is visually depicted in FIG. 3, FIGS. 4A and 4B, FIGS. 5A and 5B, FIGS. 6A and 6B. While the example embodiment depicted shows the material stack as a material stack for a ReRAM, this could conversely be done with PCM material as the material stack. Additionally, while the example embodiment depicts a circular shape to the top down view of the hybrid cell, any shape capable of being formed through patterning techniques may be selected.

Referring to step S102, a portion of the first material stack may be removed to form the first memory element. An example embodiment of this step is visually depicted in FIGS. 7A and 7B, FIGS. 8A and 8B, FIGS. 9A and 9B. While the example embodiment depicted shows an arrangement of the first memory element located around the periphery of the hybrid cell, other geometries or arrangements within the various shapes of the hybrid cell may be used.

Referring to step S103, the second memory element may be formed in area removed from the first material stack and top contact may be formed. An example embodiment of this step is visually depicted in FIGS. 10A and 10B, FIGS. 11A and 11B, FIGS. 12A and 12B.

Figure 3:
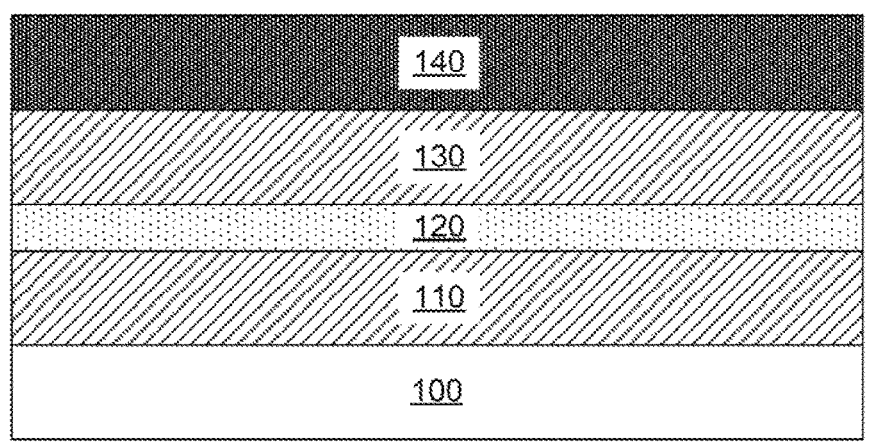
FIG. 3 depict a cross-sectional view of a first material stack for a first memory element of the memory structure, according to an example embodiment.

FIG. 3 depicts a cross-sectional view of a first material stack for a first memory element of the memory structure, according to an example embodiment. The material stack includes a Mx layer 100, a bottom electrode 110, an electrolyte 120, a ReRAM electrode layer 130, and a hardmask 140. The Mx layer 100 may be a wiring layer beneath the hybrid element, which may contain connections to other logical devices contained in a semiconductor structure.

The bottom electrode 110 and the conductive memory element 130 may be formed from a same conductive material or different conductive materials. The bottom electrode 110 and the ReRAM electrode layer 130 may include low resistance metals, such as, e.g., Al, W, Cu, TiN, TaN, or other suitable materials.

The electrolyte 120 includes a metal oxide, such as, e.g., $TiO_2$, $Al_2O_3$, $HfO_2$, $MnO_2$ or other metal oxides. The electrolyte 120 is thin, e.g., 2-5 nm in thickness, to selectively permit conduction therethrough when the bottom electrode 110 or ReRAM electrode layer 130 are activated. If the electrolyte 120 includes a metal oxide, the bottom electrode 110 or ReRAM electrode layer 130 may include an oxygen scavenging material layer adjacent to the electrolyte 120, such as, Pt, TiN, TiAlC, TiC, Ti etc. The voltages applied to the bottom electrode 110 or ReRAM electrode layer 130 cause a break down in the electrolyte 120 to adjust the resistance between the bottom electrode 110 and ReRAM electrode layer 130 by making the electrolyte 120 more conductive (or less conductive). The voltages may include millivolts to a few volts (e.g., 3 or 4 volts).

Suitable materials for the hardmask 140 include, but are not limited to, materials that can be selectively removed such as silicon nitride (SixNy), silicon oxynitride (SiON), and/or silicon carbonide nitride (SiCN), and/or oxide materials such as silicon oxide (SiOx).

Figure 4A:
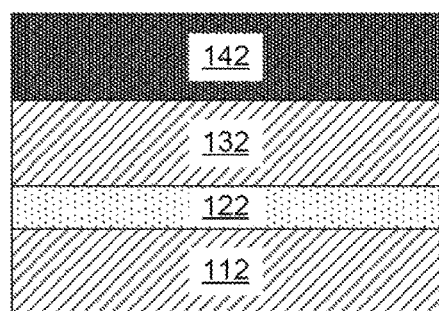
FIGS. 4A and 4B depict a cross-sectional view and top view, respectively, of patterning a memory cell from the first material stack for a first memory element of the memory structure, according to an example embodiment.
Figure 4B:
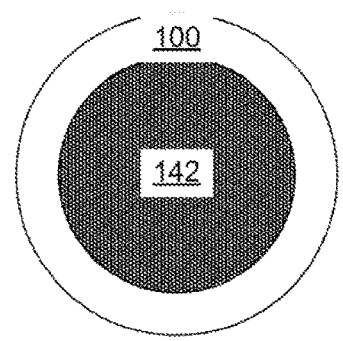

FIGS. 4A and 4B depict a cross-sectional view and top view, respectively, of patterning a memory cell from the first material stack for a first memory element of the memory structure, creating a patterned bottom electrode 112, a patterned electrolyte 122, a patterned ReRAM electrode 132, and a patterned hardmask 142. The removal of the layered structure may be performed by patterning a lithographic mask above the hardmask 140 and performing an anisotropic etch, such as a reactive ion etch (RIE), to remove the material from the bottom electrode 110, the electrolyte 120, the ReRAM electrode layer 130, and the hardmask 140 below the unpatterned portion of the lithographic mask stopping at or about the top of the Mx layer 100.

Figure 5A:
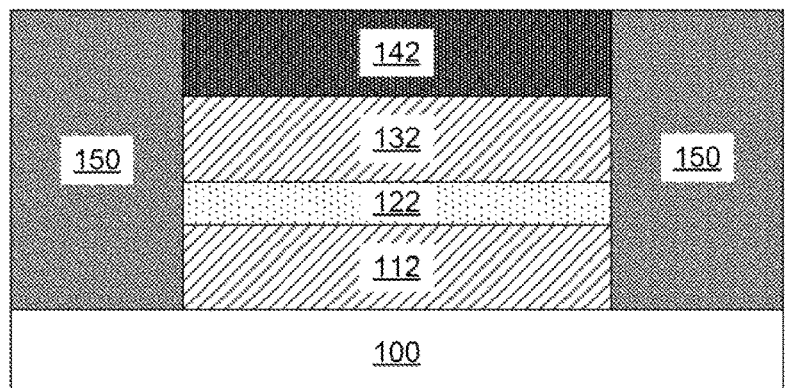
FIGS. 5A and 5B depict a cross-sectional view and top view, respectively, of forming an ILD to isolate memory cell, according to an example embodiment.
Figure 5B:
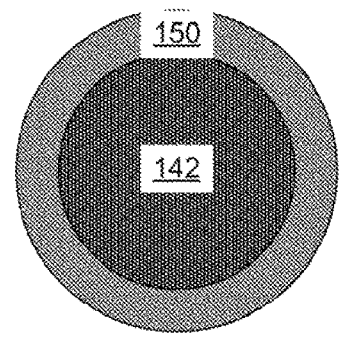

FIGS. 5A and 5B depict a cross-sectional view and top view, respectively, of forming an inter-layer dielectric (ILD) 150 to isolate memory cell. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 150 around the hybrid memory cell. Following deposition, ILD 150 can be planarized using a process such as chemical mechanical polishing (CMP).

Figure 6A:
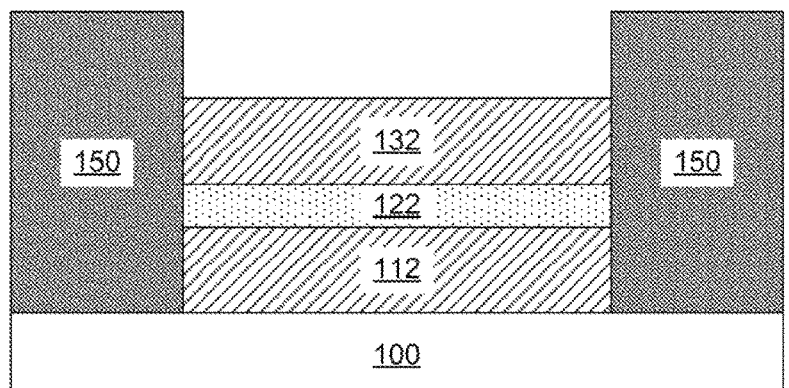
FIGS. 6A and 6B depict a cross-sectional view and top view, respectively, of removing a hardmask to expose the first material stack, according to an example embodiment.
Figure 6B:
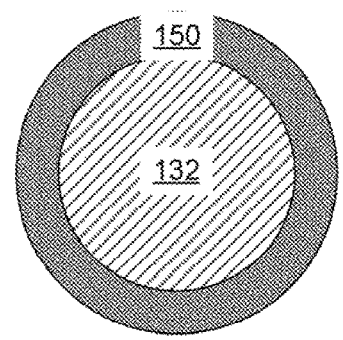

FIGS. 6A and 6B depict a cross-sectional view and top view, respectively, of removing the patterned hardmask 142 to expose the patterned ReRAM electrode 132. Patterned hardmask 142 may be removed by any suitable etching process known in the art capable of selectively removing the patterned hardmask 142 without substantially removing material from the surrounding structures. In an example embodiment, the patterned hardmask 142 may be removed, for example, by a reactive ion etching (RIE) process capable of selectively removing silicon nitride.

FIGS. 7A and 7B depict a cross-sectional view and top view, respectively, of depositing a memory element pattern 160 for a first memory element on the patterned ReRAM electrode 132. The memory element pattern 160 may be formed by conformally depositing a material on the surface of the structure depicted in FIGS. 6A and 6B, and performing an anisotropic etch, such as a RIE, to remove the material from the horizontal surfaces. It should be noted that the thickness of the conformal deposition defines the thickness of the first memory element, and therefore the surface area of the first memory element of the hybrid memory element, which may be adjusted accordingly to achieve suitable conductance profiles of the first memory element. Suitable materials for the memory element pattern 160 include, but are not limited to, materials that can be selectively removed such as silicon nitride (SixNy), silicon oxynitride (SiON), and/or silicon carbonide nitride (SiCN), and/or oxide materials such as silicon oxide (SiOx).

FIGS. 8A and 8B depict a cross-sectional view and top view, respectively, of removing the patterned ReRAM electrode 132 and patterned electrolyte 122 from the unpatterned are to provide room for the second memory element and forming ReRAM electrode 135 and first memory electrolyte 125. Removal of patterned ReRAM electrode 132 and patterned electrolyte 122 may be achieved by performing an anisotropic etch, such as a RIE etch, to remove the material from the patterned ReRAM electrode 132 and patterned electrolyte 122 that is not beneath the memory element pattern 160, and stopping at or about the top of the bottom electrode 112.

FIGS. 9A and 9B depict a cross-sectional view and top view, respectively, of removing the memory element pattern 160. Memory element pattern 160 may be removed by any suitable etching process known in the art capable of selectively removing the memory element pattern 160 without substantially removing material from the surrounding structures. In an example embodiment, the memory element pattern 160 may be removed, for example, by a reactive ion etching (RIE) process capable of selectively removing silicon nitride.

FIGS. 10A and 10B depict a cross-sectional view and top view, respectively, of depositing spacers to isolate a second memory element from the first memory element, according to an example embodiment. The spacers 170, 175 may be formed by conformally depositing a material on the surface of the structure depicted in FIGS. 9A and 9B, and performing an anisotropic etch, such as a RIE, to remove the material from the horizontal surfaces. Suitable materials for the spacers 170, 175 include, but are not limited to, insulator materials such as silicon nitride (SixNy), silicon oxynitride (SiON), and/or silicon carbonide nitride (SiCN), and/or oxide materials such as silicon oxide (SiOx).

FIGS. 11A and 11B depict a cross-sectional view and top view, respectively, of depositing a phase change material 180 for the second memory element, according to an example embodiment. The phase change material 180 may include a material that can be programmable to an amorphous (high resistance) state or a crystalline (low resistance) state with application of heat, such as a chalcogenide based material. Example chalcogenide based materials include, but are not limited to, $Ge_2Sb_2Te_5$ (GST), SbTe and $In_2Se_3$. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide (Ta2O5), hafnium oxide ($HfO_2$), zirconium oxide (ZrO2), cerium Oxide (CeO2), silicon nitride (SiN), silicon oxynitride (SiON), etc. The phase change material 180 can be deposited utilizing physical vapor deposition (PVD), magnetron-assisted sputtering, chemical vapor deposition (CVD), atomic layer deposition (ALD), evaporation, ion beam deposition, electron beam deposition, laser assisted deposition, chemical solution deposition, or any other suitable deposition techniques. After deposition, the phase change material can be planarized, for example, by chemical mechanical polish (CMP), and etched back (e.g., by RIE or wet etch) to about the same height as the spacer 170.

FIGS. 12A and 12B depict a cross-sectional view and top view, respectively, of forming the top electrode 190. The top electrode 190 may include low resistance metals, such as, e.g., Al, W, Cu, TiN, TaN, or other suitable materials. The top electrode 190 may be formed using a filing technique such as electroplating, electroless plating, chemical vapor deposition, physical vapor deposition, followed by planarization, or a combination of methods.

Following the example process outlined in FIGS. 3-12, a hybrid memory structure is formed having a first memory element, including a ReRAM electrode 135 and first memory electrolyte 125, and a second memory element, including a phase change material 180. The first memory element and the second memory element may be separated by a spacer 170. The spacer 170 may encircle (i.e., surround in the lateral direction, surrounding in the x and y direction) the second memory in the lateral direction, and the second memory element may encircle the spacer 170 in the lateral direction. The first memory element, spacer 170, and second memory element may all be located on a bottom electrode 112. Additionally, a top electrode 190 may be located on a top surface of the first memory element, spacer 170, and second memory element. Thus, a hybrid memory cell is created containing a first memory element and a second memory element, where any reading of the state of the hybrid cell is a combination of the states of the first memory element and the second memory element. In this example embodiment this may result in a hybrid memory cell in which the conductance during set operations predominantly the result of a gradual change in the conductance of the PCM of the second memory element, and the conductance during reset operations is predominantly the result of a gradual change in the conductance of the electrolyte 180 of the first memory element.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A non-volatile memory structure comprising:
    a first memory element;
    a second memory element, the first memory element and the second memory element comprise different types of memristive memory;
    a top contact, wherein the top contact is in contact with at least a portion of a top surface of the first memory element, and wherein the top contact is in contact with at least a portion of a top surface of the second memory element; and
    a bottom contact, wherein the bottom contact is in contact with at least a portion of a bottom surface of the first memory element, and wherein the bottom contact is in contact with at least a portion of a bottom surface of the second memory element.

2. The structure of claim 1, wherein the first memory element and the second memory element comprise different conductance changes for set and reset operations.

3. The structure of claim 1, a state of the non-volatile memory structure comprises a combination of the states of the first memory element and the second memory element.

4. The structure of claim 1, wherein the first memory element and the second memory element comprise different conductance changes for set and reset operations.

5. A non-volatile memory structure comprising:
    a first terminal of the non-volatile memory structure;
    a second terminal of the non-volatile memory structure; and
    a first memory element and a second memory element located in parallel between the first terminal and the second terminal, wherein the first memory element and the second memory element comprise different types of memristive memory.

6. The structure of claim 5, wherein the first memory element and the second memory element comprise different conductance changes for set and reset operations.

7. The structure of claim 5, a state of the non-volatile memory structure comprises a combination of the states of the first memory element and the second memory element.

8. The structure of claim 5, wherein the first memory element and the second memory element comprise different conductance changes for set and reset operations.

9. The structure of claim 5, a state of the non-volatile memory structure comprises a combination of the states of the first memory element and the second memory element.

10. A non-volatile memory structure comprising:
    a first memory element in parallel with a second memory element, wherein the first memory element comprises a first type of memristor, and wherein the second memory element comprises a second type of memristor; and
    a state of the non-volatile memory structure comprises a combination of the states of the first type of memristor and the second type of memristor.

11. The structure of claim 10, wherein the first memory element and the second memory element comprise different conductance changes for set and reset operations.

12. The structure of claim 10, wherein the first memory element and the second memory element comprise different types of memristive memory.

13. The structure of claim 10, wherein the first memory element comprises a phase change memory, and wherein the second memory element comprises a resistive random-access memory.

14. A non-volatile memory structure comprising:
a first memory element encircling a second memory element, wherein the first memory element and the second memory element comprise different types of memristive memory;
a spacer located between the first memory element and the second memory element;
a bottom contact in contact with a bottom surface of the first memory element and a bottom surface of the second memory element; and
a top contact in contact with a top surface of the first memory element and a top surface of the second memory element.

15. The structure of claim 14, wherein the first memory element and the second memory element comprise different conductance changes for set and reset operations.

16. The structure of claim 14, a state of the non-volatile memory structure comprises a combination of the states of the first memory element and the second memory element.

17. The structure of claim 14, wherein the first memory element and the second memory element comprise different conductance changes for set and reset operations.

18. The structure of claim 14, a state of the non-volatile memory structure comprises a combination of the states of the first memory element and the second memory element.

19. A non-volatile memory structure comprising:
a first memory element;
a second memory element, wherein the first memory element comprises a phase change memory, and wherein the second memory element comprises a resistive random-access memory;
a top contact, wherein the top contact is in contact with at least a portion of a top surface of the first memory element, and wherein the top contact is in contact with at least a portion of a top surface of the second memory element; and
a bottom contact, wherein the bottom contact is in contact with at least a portion of a bottom surface of the first memory element, and wherein the bottom contact is in contact with at least a portion of a bottom surface of the second memory element.

20. The structure of claim 19, a state of the non-volatile memory structure comprises a combination of the states of the first memory element and the second memory element.

21. A non-volatile memory structure comprising:
a first terminal of the non-volatile memory structure;
a second terminal of the non-volatile memory structure; and
a first memory element and a second memory element located in parallel between the first terminal and the second terminal, wherein the first memory element comprises a phase change memory, and wherein the second memory element comprises a resistive random-access memory.

22. A non-volatile memory structure comprising:
a first memory element encircling a second memory element, wherein the first memory element comprises a phase change memory, and wherein the second memory element comprises a resistive random-access memory;
a spacer located between the first memory element and the second memory element;
a bottom contact in contact with a bottom surface of the first memory element and a bottom surface of the second memory element; and
a top contact in contact with a top surface of the first memory element and a top surface of the second memory element.

* * * * *